United States Patent
Hofbauer et al.

(10) Patent No.: US 11,115,733 B2
(45) Date of Patent: Sep. 7, 2021

(54) DISTRIBUTOR STRIP

(71) Applicant: VERTIV INTEGRATED SYSTEMS GMBH, Arnstorf (DE)

(72) Inventors: Thomas Hofbauer, Tiefenbach (DE); Arthur Huber, Fuerstenzell (DE); Josef Feigl, Arnstorf (DE)

(73) Assignee: VERTIV INTEGRATED SYSTEMS GMBH, Arnstorf (DE)

( * ) Notice: Subject to any disclaimer, the term of this patent is extended or adjusted under 35 U.S.C. 154(b) by 48 days.

(21) Appl. No.: 16/344,064

(22) PCT Filed: Oct. 9, 2017

(86) PCT No.: PCT/EP2017/075613
§ 371 (c)(1),
(2) Date: Apr. 23, 2019

(87) PCT Pub. No.: WO2018/077596
PCT Pub. Date: May 3, 2018

(65) Prior Publication Data
US 2019/0281372 A1 Sep. 12, 2019

(30) Foreign Application Priority Data
Oct. 26, 2016 (DE) ...................... 10 2016 120 412.9

(51) Int. Cl.
*H04Q 9/02* (2006.01)
*H04Q 9/00* (2006.01)
(Continued)

(52) U.S. Cl.
CPC ................. *H04Q 9/02* (2013.01); *G06F 1/26* (2013.01); *H04Q 9/00* (2013.01); *H05K 7/1492* (2013.01); *G06F 2200/261* (2013.01)

(58) Field of Classification Search
CPC .... H04Q 9/02; H04Q 9/00; G06F 1/26; G06F 2200/261; H05K 7/1492
See application file for complete search history.

(56) References Cited

U.S. PATENT DOCUMENTS

| 7,522,036 B1 * | 4/2009 | Preuss | H05K 7/1457 307/150 |
| 8,305,737 B2 * | 11/2012 | Ewing | G05F 3/00 361/622 |

(Continued)

OTHER PUBLICATIONS

International Search Report and Written Opinion of the International Searching Authority issued in PCT/EP2017/075613, dated Jan. 30, 2018; ISA/EPO.

(Continued)

*Primary Examiner* — Thomas C Lee
*Assistant Examiner* — Anzuman Sharmin
(74) *Attorney, Agent, or Firm* — Harness, Dickey & Pierce, P.L.C.

(57) ABSTRACT

The invention relates to a master distributor strip for distributing electrical energy for equipment and/or server cabinets, comprising a plurality of connection means that are provided on a face of the master distributor strip, and to which electrical loads can be connected for the purpose of energy supply. Furthermore, sensors for determining data at least relating to the status of the master distributor strip and/or of the plurality of connection means are provided. The invention is characterized in that a communications module is provided, which module is configured to retrieve and/or receive the data of the sensors, and to communicate with at least one sensor and/or actuator that is remote from the master distributor strip, by means of a communications network. The master distributor strip furthermore comprises an information and management module which is configured to provide the data of the sensors, retrieved and received by (Continued)

the communications module, directly to a user, via a communications network interface.

8 Claims, 1 Drawing Sheet

(51) Int. Cl.
    *G06F 1/26*         (2006.01)
    *H05K 7/14*         (2006.01)

(56) References Cited

U.S. PATENT DOCUMENTS

| | | | |
|---|---|---|---|
| 8,639,459 B1 | 1/2014 | Morales et al. | |
| 9,703,342 B2 * | 7/2017 | Nicholson | G06F 1/266 |
| 2011/0309062 A1 * | 12/2011 | O'Donnell | B23K 9/0017 |
| | | | 219/130.1 |
| 2013/0046415 A1 * | 2/2013 | Curtis | H02J 3/387 |
| | | | 700/297 |
| 2013/0346783 A1 * | 12/2013 | Weber | G06F 11/3058 |
| | | | 713/340 |
| 2015/0127823 A1 * | 5/2015 | Moeller | H04W 72/0453 |
| | | | 709/224 |

OTHER PUBLICATIONS

International Preliminary Report on Patentability for PCT/EP2017/075613, IPEA/EPO, completed Sep. 28, 2018.

* cited by examiner

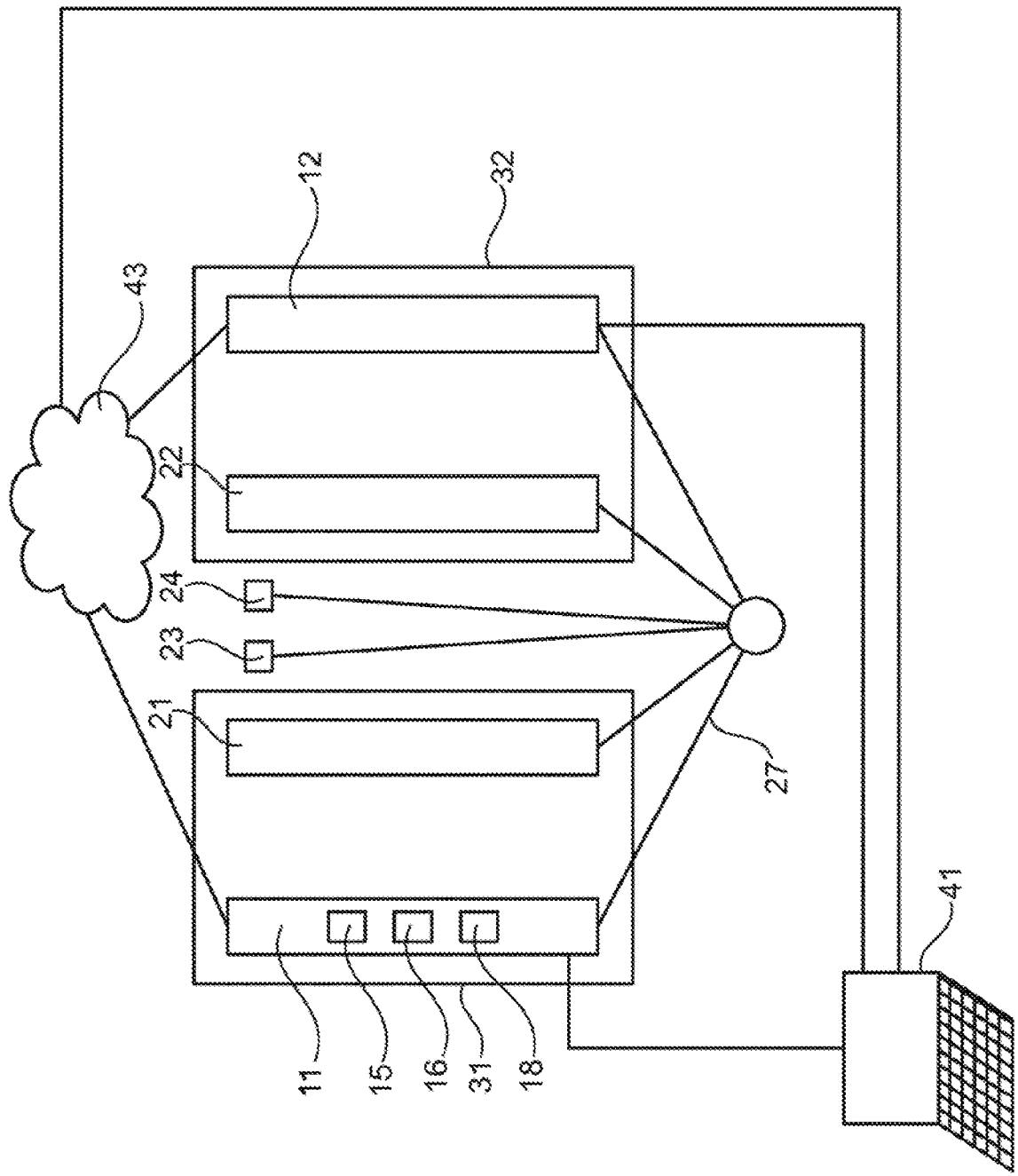

DISTRIBUTOR STRIP

CROSS-REFERENCE TO RELATED APPLICATIONS

This application is a National Stage of International Application No. PCT/EP2017/075613 filed on Oct. 9, 2017. This application claims the priority to German Patent Application No. 10 2016 120 412.9, filed on Oct. 26, 2016. The entire disclosures of the above applications are incorporated herein by reference.

FIELD

The invention relates to a distributor strip for distributing electrical energy for equipment and/or server cabinets. Distributor strips of the type in question comprise a plurality of connection means that are provided on a face, for example the upper face, of the distributor strip, and to which electrical loads can be connected for the purpose of energy supply. In addition, sensors for determining data at least relating to the status of the distributor strip and/or of the plurality of connection means are provided.

Within the meaning of the invention, a connection means can for example be considered to be a socket or coupling for connection to a plug.

BACKGROUND

This section provides background information related to the present disclosure which is not necessarily prior art.

Distributor strips are used for distributing electrical energy to electrical or electronic devices or components that are arranged in an equipment or server cabinet. In general terms, a distributor strip supplies electrical loads with energy. Devices or units that are supplied in this manner are for example servers, telecommunications devices, air-conditioning units or network components such as switches. A distributor strip can also be referred to as a socket strip or power distribution unit (PDU).

In large data centers comprising 50 or more server or component cabinets, it is conventional to provide separate management servers for managing the energy supply, as well as for managing the further surroundings of the data centers, for example for monitoring the air temperature or the like. These management servers also retrieve data from distributor strips of the type in question, and provides said data via the management system which is executed on the defined management server. This data is for example the energy consumption of the entire distributor strip, the energy output to each individual connection means, or the status regarding whether a load is connected to a connection means. Sometimes actuator systems are also provided in distributor strips of the type in question, by means of which actuator systems for example the energy output via specified connection means can be limited or changed.

A disadvantage of these known management systems which, as described, are provided on separate server means, is that said systems are usually designed for large data centers having more than 50 server cabinets. Management systems of this kind are oversized for smaller and medium data centers having for example at most 10 cabinets, and require disproportionately high management and investment outlay compared with the functionality.

SUMMARY

This section provides a general summary of the disclosure, and is not a comprehensive disclosure of its full scope or all of its features.

The object of the invention is therefore providing a solution which also allows management of distributor strips and the like in smaller and medium data centers, without letting the required outlay for management and configuration becoming disproportionately high in this case.

The object is achieved according to the invention by a distributor strip having the features of claim 1.

Preferred embodiments of the invention are set out in the dependent claims and in the description of the FIGURES.

A distributor strip of the type in question is developed according to the invention in that it comprises a communications module which is configured to retrieve and/or receive the data of the sensors, and to communicate with at least one sensor that is remote from the master distributor strip, and/or with at least one actuator that is remote from the master distributor strip, by means of a communications network. In addition, an information and management module is provided which is configured to provide the data of the sensors, retrieved and/or received by the communications module, directly to a user, via a communications network interface. In the following, a distributor strip designed in this manner will be referred to as a master distributor strip.

A key concept of the invention can be considered that of it being possible to omit a separate external management server comprising corresponding server software, because an information and management module is integrated in the master distributor strip. In other words, the functionalities of a management server having low capacities is intended to be provided on the master distributor strip, within the context of an embedded system. In this case, these may be sufficient capacities for a data center having 10 server or component cabinets and approximately 20 distributor strips connected thereto, comprising approximately 50 nodes. In this case, a node may for example be considered to be a distributor strip, a sensor that is remote from a distributor strip or an actuator that is remote from a distributor strip. The advantage of the concept according to the invention is that a solution is thus also provided for smaller data centers, which solution offers an intelligent management system without the operator needing to provide oversized software.

There is furthermore the advantage that the integration in the master distributor strip means that no additional server needs to be provided, which additional server would take up additional space in the small data centers.

The communications module can either retrieve the data of the sensors actively, or receive said data therefrom within the context of a push concept. The same also applies for the communication with the at least one sensor remote from the master distributor strip, and/or the at least one actuator remote from the master distributor strip. This data is again either actively retrieved by the information and management module, or forwarded thereto in a similar manner, by means of a push concept. The information and management module is a communications interface for a user, and the corresponding connections are provided for this purpose on the master distributor strip.

It is thus easily possible for a user to directly access the data of the sensors of the master distributor strip, to view the information, and/or to further process said information.

Within the meaning of the invention, a sensor that is remote from the master distributor strip may for example be a door contact, a temperature sensor, a sensor for the rotations of a fan per unit time, or the sensors or data interfaces of a UPS. Within the meaning of the invention, an actuator that is remote from the master distributor strip may for example be a door opener, a controllable current contact or a UPS. In an advantageous development, the communications module is furthermore designed to retrieve data relating to the status of at least one standard distributor strip which comprises a plurality of connection means provided on the face, for example the upper face, of the standard distributor strip, to which connection means electrical loads can be connected for energy supply purposes, and/or to retrieve data relating to the status of the connection means of said standard distributor strip, and/or to receive the data thereof.

Said data can then be communicated to the information and management module, and provided directly to the user, in a manner similar to the data of the master distributor strip, via the information and management module, by means of the communications network interface. In other words, the master distributor strip, and more precisely the communications module thereof, can communicate with further standard distributor strips provided in the data center, which standard distributor strips are located in the same communications network as the master distributor strip, in order to retrieve data from said standard distributor strips. Of course, these may also be a plurality of standard distributor strips.

In the case of the assumed size of a data center having 10 server cabinets, for example 1 master distributor strip and 19 standard distributor strips are in operation. This means that two distributor strips in each case are provided in a server cabinet.

In an analogous manner, the data of the standard distributor strips can ideally be provided to the user via the same communications network interface as that for the data of the master distributor strip itself.

It is advantageous for the information and management module to be designed to provide the user with at least one web interface for direct access to the data of the sensors of the master distributor strip. For this purpose, a web server may be integrated in the information and management module, via the surface of which server simple and comfortable access to the sensor data is possible.

As already set out, the access to the data of the standard distributor strip or of the plurality of standard distributor strips can also be achieved, in an analogous manner, via the web interface.

If the information and management module is configured to store the data of the sensors of the master distributor strip, the at least one standard distributor strip, sensors remote from the master distributor strip, and/or actuators remote from the master distributor strip, for a period of time, on a memory provided in the master distributor strip, and/or to store said data on a memory that can be written via a network interface, it is possible for the data that is obtained and determined by the communications module and/or the information and management module to also be logged. This can take place for example on an internal memory of the master distributor strip. It is likewise possible to provide this on a network storage means, for example within the context of a cloud solution.

If the data is stored on an external memory within the context of a cloud solution, various scenarios are conceivable here. For example, this may be a private cloud, meaning that access to said cloud can be achieved only via the master distributor strip. In other words, the user of a system of this kind communicates directly with the master distributor strip, for example with the web interface thereof, as a result of which the information and management module is prompted to provide the corresponding data from the private cloud.

Furthermore, if the cloud solution is intended to comply with another, less stringent security standard, it is also conceivable for it to be possible for a user to have direct access to the data stored in the cloud or in the network storage means. This reduces the security level of the overall system.

It is advantageous for the master distributor strip to comprise redundant components in order to ensure a corresponding security level and corresponding failure safety. For this purpose, it may be possible for two power packs and/or two communications network interfaces to be provided, for the communications module and for the information and management module. In this case it is possible for example, as is conventional in data centers, for the master distributor strip to be supplied both via Feed A and via Feed B. Of course, it is also possible for further components that are particularly relevant for the master distributor strip to be provided in duplicate, in order to ensure greater failure safety.

In an alternative configuration which, however, can optionally also be used for this purpose, 2 master distributor strips can be used simultaneously, in a data center comprising a plurality of server cabinets. In this case, the two master distributor strips are configured such that they mutually synchronize their data, and thus the system can continue to be operated, at least temporarily, in the event of failure of one master distributor strip. When using a configuration of this kind in a data center, it is preferable for a plurality of standard distributor strips to be provided which communicate with at least one of the two master distributor strips.

It is furthermore preferable for the information and management module to be configured to allow a user to specify a threshold value for at least one status of the master distributor strip, a standard distributor strip, a sensor remote from the master distributor strip, and/or an actuator remote from the master distributor strip, in order to trigger a defined action or the notification of a user upon said threshold value being exceeded. This may for example relate to temperature monitoring or power consumption.

If a specified temperature at an external sensor, or the current consumption of a connection means of a standard distributor strip is exceeded, it is thus possible, for example, for a user to be informed of this incident via an email or via an SMS server. At the same time, or taking account of a further, higher threshold value, it is also possible for the information and communications module to disconnect specific loads, via actuators provided in a corresponding standard distributor strip, or to connect a fan as an external actuator, in order to reduce the temperature.

In a similar manner, it is of course also possible to retrieve data from sensors that are not located within the standard distributor strip. It is thus possible, for example, to retrieve data from temperature sensors in a server cabinet and to control the rotational speed of the fans in accordance with the procedure described above.

An even higher benefit can be taken from the master distributor strip if the information and management module is configured to allow a user to specify a plurality of threshold values for a plurality of statuses of a selection of the master distributor strip, a standard distributor strip, a sensor remote from the master distributor strip, and an actuator remote from the master distributor strip, to logically link said values, and to communicate a message to a user and/or to trigger a defined action, depending on the result of said linking. It is thus possible, for example, to store the rule that, if the door of a server cabinet is closed and the temperature in the interior increases, the fans on the rear face of the server cabinet should rotate more quickly, but not when the door is open, because a technician is then working in the server cabinet, which explains the temperature increase, but which increase is only temporary.

The communications module can be designed such that it actively searches for further master and/or standard distributor strips and other sensors in a communications network, establishes a connection thereto, and communicates therewith. A functionality of this kind can be actively initiated by a user, for example by means of the web interface described above. Subsequently it is possible for it to be attempted, by means of a broadcast, to establish communication with further sensors or further distributor strips—whether these be standard or master distributor strips—in the same communications network or via further communications networks that can be reached via a gateway, in order to also obtain data therefrom, which data can be provided to a user via the communications network interface of the master distributor strip.

Although a plurality of standards is already available, it has been found to be advantageous for the information and management module to be designed to check the plausibility of the data, at least relating to the status of the master and/or standard distributor strips, received via the communications module, from the master and/or standard distributor strip, and from the other sensors.

In this case, a check can be provided for example such that the retrieved and obtained data are analyzed according to specified threshold values, and conclusions regarding the plausibility of said data are authorized. For example, depending on the standard, it is possible for a comma and/or decimal point to be placed at different locations. This can be identified by the plausibility check. Thus, if a temperature of 210.0° C. is received, it is identified, within the context of the plausibility check, that the decimal point has probably not been placed correctly, and the temperature is interpreted as 21.00° C. A functionality of this kind facilitates the configuration of further sensors, whether these then be provided in the data center itself or in standard distributor strips, without further additional user input being necessary.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

The invention will be explained in the following, with reference to an embodiment and a schematic drawing.

In the drawing:

FIG. 1 is a schematic view of the essential components of the concept according to the invention, in a data center.

Corresponding reference numerals indicate corresponding parts throughout the several views of the drawings.

DETAILED DESCRIPTION

Example embodiments will now be described more fully with reference to the accompanying drawings.

FIG. 1 schematically shows two server cabinets 31, 32, each comprising two distributor strips 11, 12, 21, 22. In each case, one master distributor strip 11, 12 and one standard distributor strip 21, 22 is provided in each of the server cabinets 31, 32. In addition, by way of example, two sensors 23, 24 are provided in the server room. The distributor strips 11, 12, 21, 22 and the sensors 23, 24 are interconnected via a communications network 27. In addition, the direct connection between the two master distributor strips 11, 12 and a computer 41, which is intended to symbolize the user, is shown by way of example. This connection does not have to be direct, but can instead be achieved via a conventional network. In a similar manner, the two master distributor strips 11, 12 are also directly connected to a cloud 43. Just like in the case of the connection to the computer 41, it is not essential for this connection to be achieved directly, but instead it can be implemented via a conventional communications network such as a wired, optical or wireless communications network, as well as combinations thereof.

The concept according to the invention, comprising a master distributor strip 11, 12 of the type in question, will be described in the following. The master distributor strip 11 comprises a communications module 15 and an information and management module 16. The master distributor strip 11 establishes a connection to the sensors provided in the master distributor strip 11, for example to plug sockets that are provided, via the communications module 15. Similarly, the communications network 27 establishes a communications link to the two standard distributor strips 21, 22. For this purpose, said standard distributor strips for example either also comprise a communications module or a direct connection to the communications network 27 via sensors. The communications network 27 may be a dedicated communications network for the master distributor strip 11, or a general communications network.

Analogously thereto, the communications network is also connected to the two external sensors 23, 24, given by way of example. It is thus possible for the communications module to obtain the data, acquired both in the standard distributor strips 21, 22 and in the sensors 23, 24, via the communications network 27. For this purpose, the data in the sensors 23, 24 or the standard distributor strips 21, 22 could be retrieved actively by the communications module 15, or be transmitted thereto within the context of a push service. The data thus available to the communications module 15 is shared thereby with the information and management module 16, in the master distributor strip 11. Here, the data is processed so that they are available for simple user access.

This can take place for example within the context of an embedded web server. This makes it possible for a user to access the data both of the master distributor strip 11 and of the two standard distributor strips 21, 22 and the sensors 23, 24, via the computer 41.

If the data is not intended to be used for real-time access, it is necessary to allow for said data to be logged and stored for a certain period of time, for example a month. For this purpose, an internal memory 18 is provided in the master distributor strip 11. Another option is that of storing the corresponding log data on a network storage means, within the context of a cloud solution 43. In this connection, it is possible to configure the cloud such that access is possible only directly via the master distributor strip 11. The data is thus protected accordingly.

Analogously, it is also possible to allow a user to access the cloud 43 via the computer 41.

In order to make further functionalities available to the user of a master distributor strip 11 according to the invention, it is possible for threshold values for particular sensor data to be specified in the information and management module 16, by means of an interface, and for corresponding actions to be performed in the event of said threshold values being exceeded or not being reached. It is thus possible, for example, for a sensor to provide a first threshold value, a message being sent to a user in the event of said value being exceeded. If a second, higher threshold value is exceeded, it is possible to define that the information and management module 16 should prompt a corresponding actuator to perform a specified action which ideally results in the threshold value being met again.

The integration of the additional intelligence in a master distributor strip 11 according to the invention means that said strip constitutes a security-relevant component of a data center. It is therefore preferable for said strip to be configured having a corresponding level of redundancy. This can be achieved for example by providing duplicate components in each case.

A further alternative or optional possibility for achieving this consists in providing a second master distributor strip 12 in the data center, which strip is configured in parallel with the first master distributor strip 11 and runs in shadow operation for example. The corresponding configuration and the data of the two master distributor strips 11 and 12 can then each be stored by means of an internal functionality, so as to be available simultaneously.

If one of the two master distributor strips 11, 12 fails, operation of the data center can thus be continued without any problems, at the security level that is provided by the master distributor strip 11, 12 according to the invention, and sufficient time remains to replace the failed master distributor strip 11, 12.

The concept according to the invention and the master distributor strip according to the invention also make it possible to offer corresponding management functionalities for smaller data centers.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are to be regarded as a departure from the disclosure, and all such modifications are intended to be included within the scope of the disclosure.

The invention claimed is:

1. A master distributor strip system for distributing electrical energy for equipment and/or server cabinets in a data center, comprising:
    a master distributor strip having a first hardware configuration;
    at least one standard distributor strip having a second hardware configuration which forms a different and less capable information processing hardware configuration than, the first hardware configuration, and a plurality of power connection receptacles for providing power to external loads within the data center coupled to the plurality of power connection receptacles;
    the master distributor strip having the first hardware configuration including:
        a plurality of connection receptacles that are provided on a face of the master distributor strip, and to which electrical loads can be connected for the purpose of energy supply,
        sensors in communication with the plurality of connection receptacles for determining data at least relating to a status of the master distributor strip and/or the plurality of connection receptacles,
        a communications module in communication with the sensors and configured to retrieve and/or receive the data generated by the sensors,
        an information and management module in communication with the communications module is configured to provide the data of the sensors, retrieved and/or received by the communications module, directly to a user, via a communications network interface,
    the communications module furthermore being configured to retrieve data relating to a status of the at least one standard distributor strip as well as to the electrical loads being supplied by said standard distributor strip, and/or to receive the retrieved data thereof, and to communicate said retrieved data to the information and management module, and
    the information and management module further being configured to provide the data relating to the at least one standard distributor strip and/or the electrical loads being supplied by said standard distributor strip thereof directly to the user, via the communications network interface, characterized in that the communications module is furthermore configured to communicate with at least one external sensor and/or external actuator that is remote from the master distributor strip, through a communications network,
    wherein the communication of the communications module with the at least one standard distributor strip is conducted via the communications network, and
    wherein the communications module is configured to actively search for master and/or standard distributor strips within the data center and remotely-arranged sensors in communication with the communications network, to establish a connection therewith and to communicate therewith.

2. The master distributor strip according to claim 1, wherein:
    the information and management module is configured to provide the user with a web interface for direct access at least to the data of the sensors of the master distributor strip.

3. The master distributor strip according to claim 2, wherein:
    the information and management module is configured to store data of the sensors of the master distributor strip, the at least one standard distributor strip, the at least one external sensor remote from the master distributor strip, and/or the external actuators remote from the master distributor strip, for a period of time, on a memory provided in the master distributor strip, and/or to store said data on a memory that can be written via a network interface.

4. The master distributor strip according to claim 1, wherein:
    two power packs and/or two communications network interfaces are provided for the communications module and for the information and management module.

5. The master distributor strip according to claim 1, wherein:
    the information and management module is configured to allow the user to specify a threshold value for at least one status of the master distributor strip, a standard distributor strip, the at least one external sensor remote from the master distributor strip, and/or the external actuator remote from the master distributor strip, in order to communicate a message to a user and/or to trigger a defined action, upon said threshold value being exceeded.

6. The master distributor strip according to claim 1, wherein:
the information and management module is configured to allow a user to specify a plurality of threshold values for a plurality of statuses of the master distributor strip, of the standard distributor strip, of the at least one external sensor remote from the master distributor strip, and of the external actuator remote from the master distributor strip, to logically link said statuses, and to communicate a message to the user and/or to trigger a defined action on the basis of the result of said linking.

7. The master distributor strip according to claim 1, wherein:
the information and management module is configured to check the plausibility of the data, at least relating to the status of the master and/or standard distributor strips, received via the communications module, from the master and/or standard distributor strips.

8. The master distributor strip according to claim 1, further comprising:
a plurality of server cabinets, wherein at least two of the master distributor strips are provided, and
at least one standard distributor strip is provided which communicates with at least one of the master distributor strips.

* * * * *